United States Patent [19]
Allen et al.

[11] Patent Number: 5,140,001
[45] Date of Patent: Aug. 18, 1992

[54] INTEGRATED MICROELECTRONIC ASSEMBLY COMPRISING PHOTOCONDUCTOR WITH SUPERCONDUCTING LEADS

[75] Inventors: Silas J. Allen, Summit; Robert R. Krchnavek, Bridgewater, both of N.J.

[73] Assignee: Bell Communications Research, Inc., Livingston, N.J.

[21] Appl. No.: 782,881

[22] Filed: Oct. 17, 1991

Related U.S. Application Data

[63] Continuation of Ser. No. 593,789, Oct. 5, 1990, abandoned.

[51] Int. Cl.$^5$ .................. H01B 12/00; H01L 39/12; H01L 27/12; H01L 27/14
[52] U.S. Cl. .................................. 505/1; 357/5; 357/4; 357/30
[58] Field of Search ............... 357/4, 5, 30; 505/1

[56] References Cited

U.S. PATENT DOCUMENTS

| | | | |
|---|---|---|---|
| 4,891,355 | 1/1990 | Hayashi et al. | 505/1 |
| 4,970,395 | 11/1990 | Kruse, Jr. | 357/5 |
| 5,057,485 | 10/1991 | Nishino et al. | 505/1 |
| 5,075,281 | 12/1991 | Testardi | 505/1 |

OTHER PUBLICATIONS

Rothschild et al. "Laser Patterning of Metal Oxide Superconductor Films by Reactive Solid State Transformation" *IEEE Electron Device Letters* vol. 9 No. 2 Feb. 1988, pp. 68–70.

Enomoto et al. "Optical Detector using Superconducting $BaPb_{0.7}Bi_{0.3}O_3$ Thin Films" *J. Appl. Phys.* vol. 59(11) Jun. 1, 1986, pp. 3807–3814.

Hitachi Inc. "Hitachi Applies Superconductivity to Optical Switching" *Techwatch* Jul. 1987, p. 16.

Nishino et al. "Light Detection by Superconducting Weak Link Fabricated w/High-$T_c$ Oxide-Superconductor Film" *Jap. J. Appl. Phys.* vol. 25(8) Aug. 1987, pp. L1320–L1322.

*Primary Examiner*—Andrew J. James
*Assistant Examiner*—Daniel N. Russell
*Attorney, Agent, or Firm*—Leonard Charles Suchyta; Loria J. Baskerville

[57] ABSTRACT

A beam (e.g. a focused laser beam) is utilized to irradiate the entire lateral width of a limited-extent portion of an elongated superconducting thin-film lead. The irradiated portion is converted to be non-superconducting and photoconductive. The converted portion constitutes a photodetector integrated with associated superconducting leads.

8 Claims, 1 Drawing Sheet

INTEGRATED MICROELECTRONIC ASSEMBLY COMPRISING PHOTOCONDUCTOR WITH SUPERCONDUCTING LEADS

This application is a continuation of application Ser. No. 07/593,789, filed Oct. 5, 1990 now abandoned.

BACKGROUND OF THE INVENTION

This invention relates to superconducting materials and, more particularly, to microelectronic assemblies made from such materials.

The recent discovery of superconducting materials characterized by relatively high critical temperatures has spawned an extensive effort to understand and improve the materials. Moreover, considerable work has been done to begin processing the materials for eventual device fabrication.

One potentially promising area for superconductors is in the field of microelectronics. For this application, high-quality superconducting thin films on a variety of substrates have been demonstrated. However, useful application of these thin films requires subsequent processing to fabricate the various component structures required to form microelectronic assemblies.

Patterning a superconducting thin film to form leads that can serve as interconnects in an assembly has been accomplished. But little if any success has been reported heretofore on attempts to process the film to make additional components. If available, such components could be interconnected by patterned superconducting leads to form a microelectronic assembly.

Accordingly, considerable effort has been directed at trying to process a superconducting thin film to fabricate useful devices therein. It was recognized that this effort if successful had the potential for achieving integrated microelectronic assemblies in superconducting films.

SUMMARY OF THE INVENTION

In accordance with the principles of the present invention, a superconducting thin film is processed to form an integrated microelectronic assembly that comprises a photoconducting device having one or more superconducting leads connected thereto. In particular, the entire lateral width of a limited portion of a superconducting thin-film lead is irradiated to render the portion non-superconducting and semiconducting and capable of generating charge carriers in response to incident light such that the portion is a practical and useful photoconductor.

In accordance with a more specific feature of the invention, a focused laser beam is utilized to irradiate a localized portion of a thin-film lead made from an oxygen-containing superconducting material. Laser-induced heating of the localized portion causes oxygen to be emitted from the material. The degree of oxygen removal in the lasermodified portion is controlled to achieve a semiconducting or semiconducting-like material that does not show any evidence of superconductivity and that exhibits the properties of a photoconductive detector. Such a detector is disposed in intimate contact with unmodified superconducting regions of the thin-film lead. These regions serve as electrical interconnects for the detector.

BRIEF DESCRIPTION OF THE DRAWING

A complete understanding of the present invention and of the above and other features thereof will be apparent from a consideration of the detailed description below taken in conjunction with the accompanying drawing, not drawn to scale, in which.

DETAILED DESCRIPTION

The principles of this invention are applicable to a variety of high-critical-temperature oxygen-containing superconductors. Herein, for purposes of a specific illustrative example, emphasis will be mainly directed to the conventional superconducting material known as $YBa_2Cu_3O_7$. Other standard oxygen-containing superconductors such as the La—Cu—O, Tl—Ba—Ca—Cu—O, Bi—Sr—Ca—Cu—O, and RE—Ba—Cu—O systems, where RE is a rare earth that could be substituted for Y, are also suitable for forming thin films from which a microelectronic assembly of the type described below can be formed.

Figure 1:
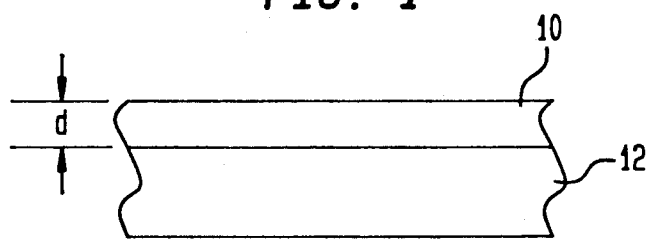
FIG. 1 is a side-view representation of a superconducting thin film formed on a substrate.

In accordance with the invention, a superconducting thin film 10 is prepared on the entire top surface of a substrate 12, as represented in FIG. 1. By way of example, the substrate 12 comprises (110) or (001) $SrTiO_3$ or (001) $LaAlO_3$. The latter is usually preferred for high speed applications since it does not exhibit the relatively large dielectric constant of $SrTiO_3$. Other substrate materials such as silicon may be suitable if appropriate buffer layers (not shown) are interposed between the substrate 12 and the thin film 10 to prevent deleterious high-temperature reactions therebetween.

Illustratively, a thin film 10 of $YBa_2Cu_3O_7$ is prepared on the substrate 12 of FIG. 1 by co-evaporation of Y, $BaF_2$ and Cu in the presence of $O_2$. (Alternatively, a thin film of this material can be formed by pulsed laser deposition.) Subsequently, to remove the fluorine constituent from the deposited material, the film 10 is annealed at about 850 degrees Celsius for approximately 30 minutes in oxygen with an $H_2O$ partial pressure of about 0.02 atmosphere. The thickness of the film 10 prepared in this manner is typically less than about one micrometer (for example, in the range of 0.1-to-1 micrometer).

Figure 2:
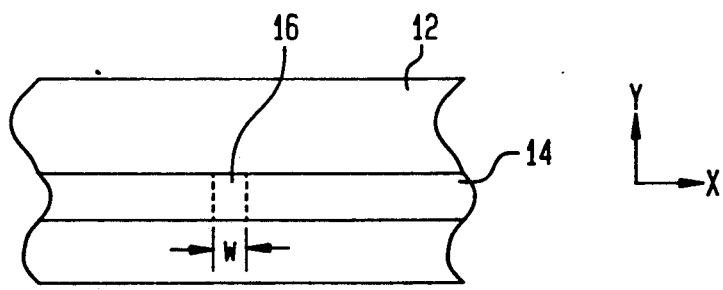
FIG. 2 is a top view of a specific illustrative assembly made in accordance with the principles of the present invention.

The superconducting thin film 10 of FIG. 1 is then processed to remove all but an elongated portion thereof from the top surface of the substrate 12. As shown in FIG. 2, the portion 14 of the thin film remaining on the substrate 12 comprises an elongated portion that constitutes a superconducting lead. Illustratively, the Y-direction extent of the lead 14 is about 10-to-50 micrometers.

Patterning of the thin film 10 of FIG. 1 to form the superconducting lead 14 of FIG. 2 is done, for example, utilizing standard photolithographic techniques, followed by wet etching with a one-volume-per-cent solution of $HNO_3$. Alternatively, the superconducting lead 14 is patterned from the originally deposited thin film 10 by conventional ion milling.

In accordance with the invention, the entire lateral or Y-direction extent of a relatively narrow X-direction region of the superconducting lead 14 of FIG. 2 is then irradiated. The irradiated region of the lead 14 is contained between the dash lines show in FIG. 2 and is designated therein by reference numeral 16. By way of example, the width w of the irradiated region 16 is about 3 micrometers.

Illustratively, the region 16 of FIG. 2 is irradiated and thereby modified by directing thereat a focused laser beam. Thus, for example, the region 16 can be modified by utilizing a conventional scanning system that includes an Ar+ laser tuned to 514.5 nanometers and focused to a spot having a diameter of 2 micrometers (50x, 0.60 NA). The laser beam is advantageously directed into a vacuum chamber where the film-containing substrate to be irradiated is mounted on a conventional set of computer-controlled translation stages. Illustratively, the lateral (Y direction) scanning rate is about 10 micrometers per second. The vacuum chamber is, for example, evacuated to approximately one millitorr, and typical incident laser power levels are less than about 60 milliwatts.

Laser irradiation of the region 16 of FIG. 2 causes localized heating thereof. As a result, oxygen contained in the superconducting material of the region 16 is released into the vacuum chamber. The degree of such modification of the structure of the superconducting material in the region 16 can be monitored and controlled by measuring the room-temperature electrical resistance of the lead 14 during laser irradiation. Such a measure indicates in effect the amount of oxygen removed from the region 16. In practice, the resistance of the modified region 16 is typically increased several orders of magnitude and the region is made semiconducting. The sections of the lead 14 that are not irradiated are not modified.

Due to laser irradiation, sufficient oxygen is removed from the region 16 (FIG. 2) to convert it from a superconducting material to a superconducting material with a reduced transition temperature and then to a region that exhibits semiconducting or semiconducting-like behavior with no evidence of a superconducting transition. In other words, the irradiated region loses its superconducting properties and is converted to an oxygen-deficient semiconducting or semiconducting-like region that lies in intimate contact with the remaining unmodified portions of the superconducting lead 14.

Illustratively, for the superconducting material $YBa_2Cu_3O_7$, laser irradiation causes the material in the region 16 to be converted to $YBa_2Cu_3O_{6+x}$, where x is less than the value that will cause the region to be superconducting. In particular, to achieve a semiconducting or semiconducting-like characteristic, the value of x in the region 16 should advantageously be in the range of approximately 0 to 0.4.

Significantly, the region 16 of FIG. 2 modified in the specific manner detailed above no longer exhibits the inherent superconductive photo-responsive characteristic but is now a practical photoconductor. In response to incident light directed at some part or all of the surface area of the region 16, the region 16 generates carriers and thus provides an electrical current flow in the associated contacting portions of the lead 14. Hence, the region functions as a photoconductor capable of detecting input light signals and converting them in effect into electrical signals that propagate in the leads connected to the region 16. For operation below the critical temperature of $YBa_2Cu_3O_7$, these leads constitute superconducting interconnects for the photodetector formed in the region 16. In turn, these interconnects can extend to other components (not shown) of a microminiature electronic assembly formed on the substrate 12.

Laser irradiation of the region 16 of FIG. 2 need not occur in a vacuum. It should, however, advantageously occur in a non-oxygen-containing ambient. Otherwise, the temperature to which the region 16 must be raised to release oxygen therefrom may cause melting or other deleterious effects in the region. An example of a suitable alternative ambient is pressurized nitrogen.

Also, in accordance with this invention, various forms of irradiation other than a laser beam can be utilized to modify a region of the aforespecified superconducting material to render it photoconductive. Thus, for example, beams of ions, electrons or neutrons are also effective to achieve the desired modification. Or the modification may be achieved by masking all of the lead 14 (FIG. 2) except for the region 16 with a highly reflective masking material and then intensely flood lighting the masked structure to heat up and release oxygen only from the unmasked region 16.

Finally, it is to be understood that the various specific arrangements and techniques described herein are only illustrative of the application of the principles of the present invention. In accordance with these principles, numerous alternatives and modifications may easily be made by those skilled in the art without departing from the spirit and scope of the invention.

What is claimed is:

1. A photoconductor device having integrated superconducting leads comprising
   a substrate and
   a continuous elongated thin-film element formed on the top surface of said substrate, said element comprising
   a limited-extent portion and
   two end portions, said limited-extent portion, which was originally superconductive, being rendered semiconductive and practically photoconductive through processing such that quiescently in the absence of incident light directed thereat said limited-extent portion does not exhibit superconductive properties but possesses semiconductive properties and, in response to incident light, a practical photoconductive characteristic due to photoinduced carrier generation, said end portions defining monolithically-integrated, superconductive leads for said limited-extent portion.

2. An assembly as in claim 1 wherein said superconducting material contains oxygen and the material of said limited-extent portion is, quiescently in the absence of incident light directed thereat, oxygen-deficient relative to the oxygen content of said superconducting material.

3. An assembly as in claim 2 wherein said superconducting material comprises $YBa_2Cu_3O_7$.

4. An assembly as in claim 3 wherein the material of said limited-extent portion comprises $YBa_2Cu_3O_{6+x}$, where x has a value between 0 and 0.4.

5. An assembly as in claim 4 wherein the portion of said element made of a superconducting material constitutes an electrical lead in direct contact with said photoconductive limited-extent portion.

6. A device as in claim 4 wherein the thickness of said thin-film element is everywhere approximately the same along its entire length and wherein the width of said thin-film element is everywhere approximately the same along its entire length.

7. A photoconductor device in accordance with claim 1 wherein said superconducting material comprises $YBa_2Cu_3O_7$.

8. A photoconductor device having integrated superconducting leads comprising
a substrate and
a continuous thin-film element of a high critical-temperature oxygen-containing superconducting material positioned on said substrate, said element having a limited-extent portion between two end portions, said limited-extent portion having been carefully subjected to an irradiation to deplete the oxygen in said limited-extent portion, thereby to render said limited-extent portion non-superconducting but semiconductive and exhibiting practical photoconductive properties due to photoinduced carrier generation; such that said limited-extent portion is practically useful as a photoconductor, said end portions defining the monolithically-integrated leads for said limited-extent portion.

* * * * *